(12) United States Patent
Tan et al.

(10) Patent No.: US 8,421,045 B2
(45) Date of Patent: Apr. 16, 2013

(54) ELECTROMAGNETIC PROTECTION CLOTH

(75) Inventors: Daniel Qi Tan, Rexford, NY (US);
Patricia Chapman Irwin, Altamont, NY (US); Wei Zhang, Ballston Lake, NY (US)

(73) Assignee: BHA Group, Inc., Kansas City, MO (US)

( * ) Notice: Subject to any disclaimer, the term of this patent is extended or adjusted under 35 U.S.C. 154(b) by 0 days.

(21) Appl. No.: 13/218,869

(22) Filed: Aug. 26, 2011

(65) Prior Publication Data

US 2013/0048370 A1    Feb. 28, 2013

(51) Int. Cl.
*G21F 3/02* (2006.01)
*H01J 29/46* (2006.01)
*H01J 5/18* (2006.01)

(52) U.S. Cl.
USPC ................................ 250/516.1; 250/519.1

(58) Field of Classification Search ............... 250/505.1, 250/515.1, 516.1, 519.1, 526
See application file for complete search history.

(56) References Cited

U.S. PATENT DOCUMENTS

| | | | | |
|---|---|---|---|---|
| 4,254,202 A | * | 3/1981 | Matsumoto et al. ........ | 430/122.7 |
| 4,286,861 A | * | 9/1981 | Matsumoto et al. ............ | 399/92 |
| 4,314,018 A | * | 2/1982 | Matsumoto et al. ..... | 430/122.51 |
| 4,380,579 A | * | 4/1983 | Matsumoto et al. ........ | 430/125.3 |
| 5,453,328 A | * | 9/1995 | Nagano et al. ................ | 428/545 |
| 5,455,116 A | * | 10/1995 | Nagano et al. ................ | 428/545 |
| 5,455,117 A | * | 10/1995 | Nagano et al. ................ | 428/545 |
| 5,497,138 A | * | 3/1996 | Malpiece et al. ............... | 338/21 |
| 5,720,859 A | * | 2/1998 | Czubarow et al. ........ | 204/157.43 |
| 5,776,609 A | * | 7/1998 | McCullough ................. | 428/375 |
| 5,908,584 A | * | 6/1999 | Bennett ......................... | 252/502 |
| 7,060,350 B2 | * | 6/2006 | Takaya et al. ................. | 428/323 |
| 7,476,889 B2 | * | 1/2009 | DeMeo et al. ............. | 250/516.1 |
| 7,518,137 B2 | * | 4/2009 | Okamura et al. ........... | 250/515.1 |
| 7,815,820 B2 | * | 10/2010 | Tan et al. ..................... | 252/518.1 |
| 2006/0180342 A1 | * | 8/2006 | Takaya et al. ................. | 174/256 |
| 2006/0251203 A1 | | 11/2006 | Okamura et al. | |
| 2007/0159753 A1 | | 7/2007 | Randall | |
| 2010/0059243 A1 | | 3/2010 | Chang | |
| 2011/0210274 A1 | * | 9/2011 | Kempe et al. ............... | 250/516.1 |
| 2012/0219791 A1 | * | 8/2012 | Tan et al. ....................... | 428/336 |

FOREIGN PATENT DOCUMENTS

WO    2004032580 A2    4/2004

OTHER PUBLICATIONS

UK Search Report dated Dec. 5, 2012.

* cited by examiner

*Primary Examiner* — Bernard E Souw

(57) ABSTRACT

An article for providing protection from electromagnetic energy, and an associated method for provision of such. The article includes conductive fibers extending within the article, varistor material dispersed and secured within the article, and ferrite material dispersed and secured within the article.

20 Claims, 2 Drawing Sheets

ELECTROMAGNETIC PROTECTION CLOTH

BACKGROUND OF THE INVENTION

1. Field of the Invention

The present invention relates an article, such a cloth sheet or fabric, and more particularly, to articles, such as cloth structures, that provide protection from electromagnetic energy.

2. Discussion of the Prior Art

Many fields of endeavor include an aspect that electromagnetic energy, in various forms, is propagating through the atmosphere and may undesirably impinge upon a recipient, such as a person, article, electronic equipment or living organism. For example, electromagnetic energy pollution can emanate from many structures, devices, and lines through which electric current flows and generates electromagnetic fields. Examples of such structures, devices and lines that may cause such electromagnetic energy waves include the following categories: radio, television, telephone, cellular communication, microwave oven, satellite transmission and power transmission lines. Many other examples are possible. Electromagnetic energy from such examples could be considered passive or unintentional since impingement upon a recipient is not the primary purpose. In addition, it is possible that undesirably impingement of electromagnetic energy upon a recipient can be based upon an intentional directing of the electromagnetic energy. Such a situation would occur with the use of direct energy weapons or monitoring equipment.

The range frequencies of possible impinging electromagnetic energy can vary greatly. For example, frequencies of the electromagnetic energy can include 50 Hz for domestic electric power, 30 kHz for radio waves, 200 MHz (VHF) and 800 MHz (UHF) for television, and 3-300 GHz for microwave ovens and satellite broadcasts. It is possible that directed energy weapon sources may have multiple and varied frequencies such as 50 Hz-300 GHz.

It is possible that such electromagnetic energy waves can be disruptive to the recipient. In the case of a recipient being a person, issues concerning health and possible severe or fatal diseases are possible. At some level, it is possible that many people receive at least some electromagnetic energy impingement. However, it is reasonable that some people, possibly based upon locality and/or activity, may receive some greater amounts of electromagnetic energy impingement. As one example, within a military setting if directed energy weapons are employed, recipients may experience greater amounts of electromagnetic energy impingement. Again, the recipients may include people or articles. Thus, protection shielding from such electromagnetic energy impingement could be beneficial.

Some limited work has already been conducted within the area of providing electromagnetic energy shielding. For example, fabrics with fine wires woven therein have been contemplated. However, from such prior work may have some limitations. For example, the protection shielding is for some, but not all, of the possible frequencies of electromagnetic energy. Thus there are needs for continued improvements in the area of protection from electromagnetic energy.

BRIEF DESCRIPTION OF THE INVENTION

The following presents a simplified summary of the invention in order to provide a basic understanding of some example aspects of the invention. This summary is not an extensive overview of the invention. Moreover, this summary is not intended to identify critical elements of the invention nor delineate the scope of the invention. The sole purpose of the summary is to present some concepts of the invention in simplified form as a prelude to the more detailed description that is presented later.

In accordance with one example aspect, the present invention provides an article for providing protection from electromagnetic energy. The article includes conductive fibers extending within the article, varistor material dispersed and secured within the article, and ferrite material dispersed and secured within the article.

In accordance with an other example aspect, the present invention includes a method of providing an article that can provide protection from electromagnetic energy. The method includes providing conductive fibers extending within an article, providing varistor material dispersed and secured within the article, and providing ferrite material dispersed and secured within the article.

BRIEF DESCRIPTION OF THE DRAWINGS

The foregoing and other aspects of the present invention will become apparent to those skilled in the art to which the present invention relates upon reading the following description with reference to the accompanying drawings, in which.

DETAILED DESCRIPTION OF THE INVENTION

Figure 1:
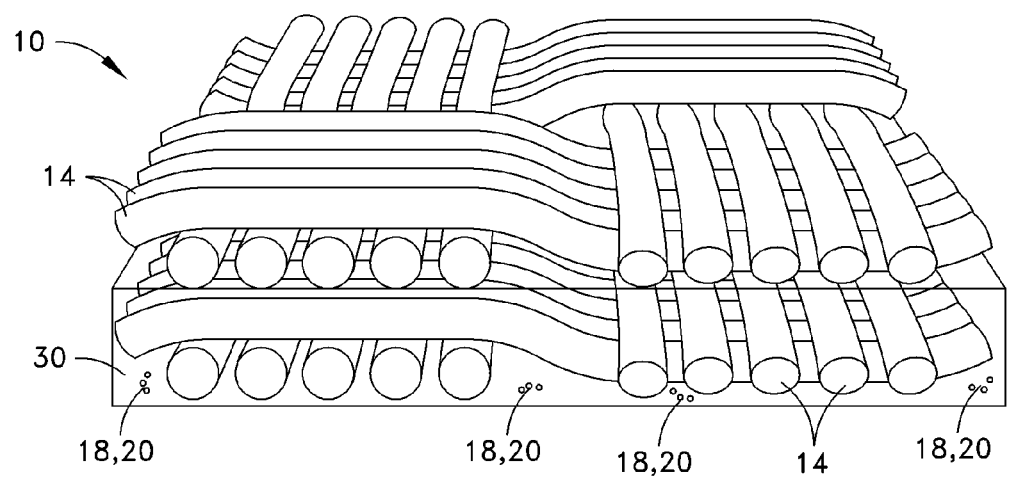
FIG. 1 is a schematized perspective view, partially in section, of a segment of an example article as an example cloth in accordance with at least one aspect of the present invention.

Example embodiments that incorporate one or more aspects of the present invention are described and illustrated in the drawings. These illustrated examples are not intended to be a limitation on the present invention. For example, one or more aspects of the present invention can be utilized in other embodiments and even other types of devices. Moreover, certain terminology is used herein for convenience only and is not to be taken as a limitation on the present invention. Still further, in the drawings, the same reference numerals are employed for designating the same elements.

Figure 2:
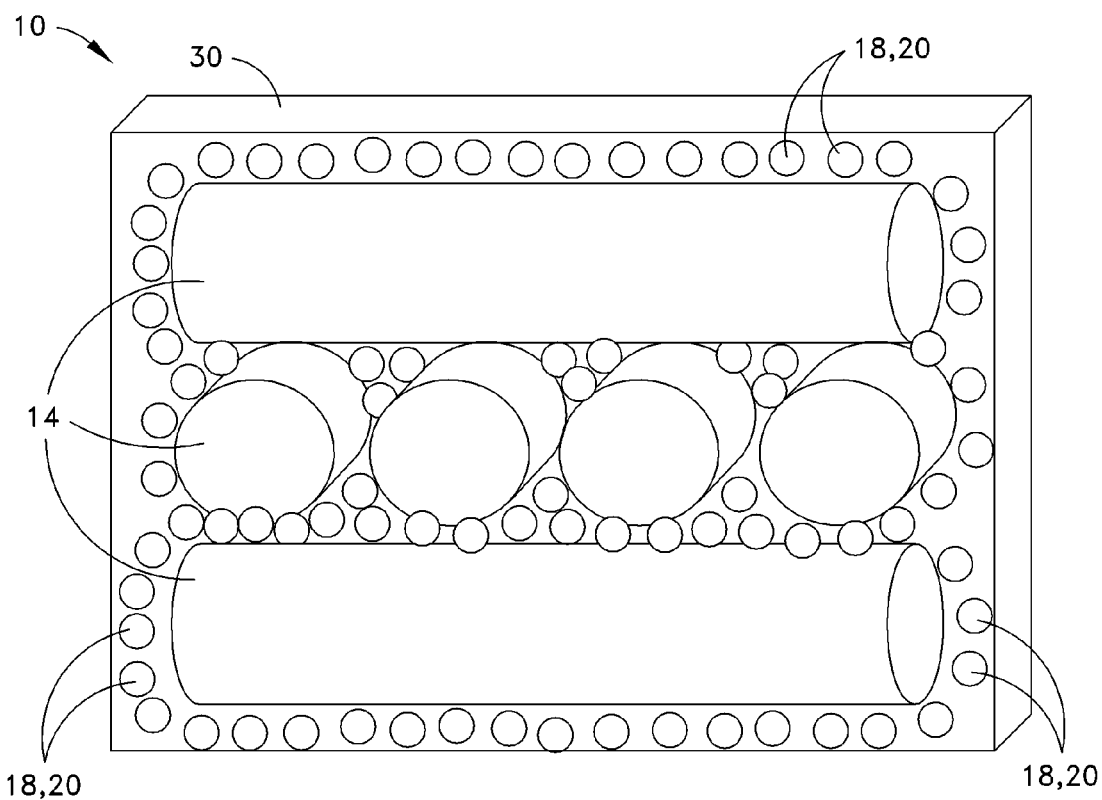
FIG. 2 is an enlarged view of the example article of FIG. 1.

Turning to FIGS. 1 and 2, a segment of an example article 10 is shown in accordance with at least one aspect of the subject invention. It is to be appreciated that the article 10 can take several forms, such as a cloth, batt, molded item, or the like. An example of the article 10 is presented herein as a cloth. However, it is to be appreciated that the present invention need not be so limited. It should be appreciated that the portion of the cloth shown within the drawing figures may be considered to be only a small portion of the overall cloth, and that the cloth may have an extent that is much greater than the portion shown within the figures. Also it is to be appreciated that the present invention includes one of more methods of providing or making the article 10.

The article 10 includes at least a conductive fiber 14 extending within the article, a varistor material 18 within the article, and a ferrite material 20 within the article. Within the shown example, at least one conductive fiber 14 is present. More specifically, within the shown example a plurality of fibers 14 extend within the article 10. Also, within the example, the varistor material 18 is dispersed within the article 10. Still further, within the shown example the ferrite material 20 is dispersed within the article 10. It is to be appreciated that only a sample portion of the overall varistor material 18 and the overall ferrite material 20 may shown with FIGS. 1 and 2. The drawing figures are merely illustrations and are not to be construed as representative of dispersion/distribution of the varistor material 18 and the ferrite material 20.

Turning to the conductive fibers 14, the conductive fibers may be woven or unwoven. The shown example of FIGS. 1 and 2 is one specific example of a woven arrangement of conductive fibers 14. It is to be appreciated that any desired weaving pattern, arrangement, order can be utilized. However, it is to be appreciated that the present invention is not merely limited to the example woven cloth shown within the figures and thus, the conductive fibers 14 may be arranged in any uniform/orderly fashion or may have random orientation. A woven arrangement is just one example of a uniform arrangement. As such, within the shown example, the conductive fibers 14 are woven and have a general orderly orientation to provide a matrix appearance.

Within the shown example, the extent of the conductive fibers 14 within the shown example is over the entire area (i.e., within length) of the article 10. However, it is to be appreciated that the extent of the conductive fibers 14 may be something less than the entire extent of the article 10. For example, there may be areas within the article 10 (e.g., border areas or areas within the field of the article) which may prove to be desirable to omit the conductive fibers 14.

Turning to the details of the conductive fibers 14, many types of conductive materials could be utilized within the conductive fibers. Within one example, the conductive fibers 14 are made of carbon such that the fibers can be referred to as carbon fibers. However, it is possible that other conductive materials (e.g., metals such as stainless steel, nickel, copper) or other wise made to be conductive (e.g., injected with conductive material) may be utilized. As can be appreciated, the conductive fibers 14 provide a conductive path through which electromagnetic energy may move along the article 10. The conductive fibers 14 can touch and, if touching, can provide conductive pathways between fibers.

Turning to the varistor material 18, in one example the varistor material has electromagnetic properties that can be considered to be lossy. Such electromagnetic lossiness can used to provide energy dissipation via magnetic or electric loss. Also, within at least some examples of the varistor material 18, the varistor material has electromagnetic properties that can vary dependent upon imposed electromagnetic energy. For example, properties may vary dependent upon imposed field strength of the electromagnetic energy. The varistor material 18 may have the property of a nonlinear relationship between current and voltage. Also, the varistor material 18 may have the properties that are both dielectric and magnetic. The varistor material 18 may be responsive to high energy and change from an insulating state to a conducting state in response to the high energy.

Turning to some examples of varistor material, one example is a metal oxide varistor (MoV). For example, the varistor may contain a ceramic mass of zinc oxide within a matrix (e.g., coated) of other metal oxides, such as bismuth, cobalt, and/or manganese.

Four example Varistor materials include:
1) $ZnO$; $ZnO-Bi_2O_3$; $ZnO-Bi_2O_3-Sb_2O_3$; $ZnO-Bi_2O_3-Sb_2O_3-CoO-NiO-MnO_2$;
2) $SnO_2$; $SnO_2-CoO-Nb_2O_5-Cr_2O_3$.
3) $TiO_2$ doped with $NbO_5$, $Bi_2O_3$ and $SrO$; $TiO_2$ doped with $Ta_2O_5$ and $CaO$
4) $(SrBa)TiO_3$ doped with $Nb_2O_5$ and $Li_2CO_3$; $(SrBaCa)TiO_3$ It is to be appreciated that the shown example provides that the varistor material 18 present within the article 10 as part of a particle form. The particles of varistor material 18 may be retained within the article via the use of integration into fibers, attachment to the fibers and/or suspension within resin that is adhered to the fibers. It is to be appreciated that other filler and/or adhesive material/mechanism can be utilized. Within the shown example, the particles of varistor material 18 are suspended in resin 30 that is adhered to the fibers 14. Within one example, the size of the particles of the varistor material 18 is approximately 50 nm to 50 micron in diameter.

As mentioned, one specific example includes the varistor material 18 disbursed within the article 10 as particles (e.g., varistor material particulate). Such dispersion within the article 10 can be accomplished by having the particulates being located throughout the article. In general, if the varistor material 18 is provided is some form other than particles, it may still be desirable to disperse the varistor material 18 within the article such that the varistor material is located throughout the article. However, it is to be appreciated that the extent of distribution of the varistor material 18 may be something less than the extending entirely throughout the article 10. For example, there may be areas within the article 10 (e.g., border areas or areas within the field of the article) which may prove to be desirable to omit the varistor material 18.

Turing to the ferrite material 20, the ferrite material is iron, iron-based or an iron alloy. As such, the ferrite material 20 may have a magnetic property.

Two example ferrite materials include:
1) $(NiZn)Fe_2O_4$; $(NiZnCu)Fe_2O_4$; $(NiMnCo)Fe_2O_4$, $(MnZn)Fe_2O_4$; $ZnFe_2O_4$; $NiFe_2O_4$; $CoFe_2O_4$; $(CoZn)Fe_2O_4$
2) $Fe_3O_4$ The ferrite material 20 can be dispersed within the article 10. Within one example which is shown within FIGS. 1 and 2, the ferrite material 20 is dispersed within the article 10 via being coated upon the varistor material 18 within particles (i.e., the varistor material 18 is inside a coating of ferrite material 20 in particle form). In one example the shell thickness of the ferrite material 20 that surrounds the varistor material 18 within particles is approximately 5 nm-100 nm. The particles (i.e., varistor and ferrite materials) are dispersed within the article and as such the ferrite material 20 is dispersed is a co-existent manner with the varistor material 18 within the article 10.

The ferrite material 20 can act as an aide to the varistor material 18 and/or the conductive fibers 14 to provide a protective shielding effect against electromagnetic energy by the article 10. Overall, the article 10 may provide for magnetic and/or dielectric loss of energy to provide such protective shielding. However, such losses may not be the only form of protection provided by the article 10. For example, some amount of reflection of the impinging electromagnetic energy is possible. For example, the conductive fibers 14 may have a reflective property to the electromagnetic energy. It is possible that use of the invention within a static arrangement may also employ the use of grounding of the article 10 to earth. However, certainly for mobile applications, the article 10 need not be grounded to earth.

It is contemplated that the conductive fibers 14 provide protection from electromagnetic energy over a first range of frequencies of electromagnetic energy and the varistor material 18 provides protection from electromagnetic energy over a second range of frequencies of electromagnetic energy, and the ferrite material 20 provides protection from electromagnetic energy over a third range of frequencies of electromagnetic energy, with the first, second and third ranges of frequencies being different from each other. For such a scenario, the article 10, with the three components (the conductive fibers 14, the varistor material 18 and the ferrite material 20) provides an overall broad coverage over a broad spectrum. For example, the frequencies involved may include the following examples: approximately 50-60 Hz (e.g., from domestic electrical power), approximately 30 kHz (e.g., from radio waves), approximately 200 MHz (VHF) and approximately 800 MHz (UHF) (e.g., from television broadcast), and approximately 3-300 GHz (e.g., from microwave ovens, satellite transmissions and direct energy weapons).

Turning to the construction of the article 10, it is possible that different types of example constructions can be utilized. Within the shown example, the varistor material 18, as particles with the ferrite material 20 coatings, are interspersed among the conductive fibers 14. It is to be appreciated that the particles (varistor and ferrite materials) are secured within the article 10 and thus secured relative to the conductive fibers 14. As such, the particles could be considered to be part of a filler which the particles are conveyed/supported/adhered/fixed via a medium which is applied to the conductive fibers. For example, the particles may be conveyed within a polymer solution that is applied to the conductive fibers. The solution may be fixed, solidified, evaporated, or the like thus the leaving the particles impregnated into and secured relative to the conductive fibers within a polymer material. Also, the particles may be applied via the use of a coating mechanism onto the conductive fibers. Again, curing, evaporation, or the like could be employed to secure and retain the particles relative to the conductive fibers. Such can provide for the example polymer/resin 30 shown within FIGS. 1 and 2.

Also, it is to be appreciated that the shown example indicates that most/all of the shown fibers are the conductive fibers 14. However, it is possible that some (few or many) of the fibers within the article 10 are fibers that are not the conductive fibers 14. Such "other fibers" may be interspersed (e.g., interwoven or otherwise placed between) within the conductive fibers 14. As another possibility, non-conductive fibers may be present in the article 10 within different, additional layer(s). Some examples of "other" fibers may include polyester-based fibers (interspersed or a separate layer). Still further, the article 10 may include aramid fibers (interspersed or a separate layer) to provide a flame retardant function. Still further, the article 10 may include acrylic fibers (interspersed or a separate layer), which may provide added strength. Also, the article 10 may include nylon fibers or an olefin fibers (again, either as interspersed or a separate layer). Still further, the article 10 may include polylactic acid as part of the fibers (e.g., for low moisture absorption and high wicking, offering benefits for sports and performance apparel and products).

Still further, it is to be appreciated that the conductive fibers 14, varistor material 18, and ferrite material 20 may be only part of the components within the article 10. For example, the article 10 may have other components that are not directly participating in a primary electromagnetic shielding function. For example, the article may contain other fibers (as mentioned), other layers (e.g., non-fiber layers such membrane layers) or the like. For example, the article may include a layer ePTFE, which is a breathable layer.

The article 10 may be utilized within various examples of constructed cloth fabric devices. Of course cloth fabrics are one example in which flexibility of the article as a cloth is a characteristic. Many such cloth fabric examples include various pieces of clothing including shirts, jackets, coats, pants, hats and gloves. To be certain, it is possible that any piece of clothing that can be worn by a person could incorporate the article 10 in accordance within an aspect of the present invention. Such article 10 within a piece of clothing would provide electromagnetic shielding protection to the wearer of the article of clothing.

Figure 3:
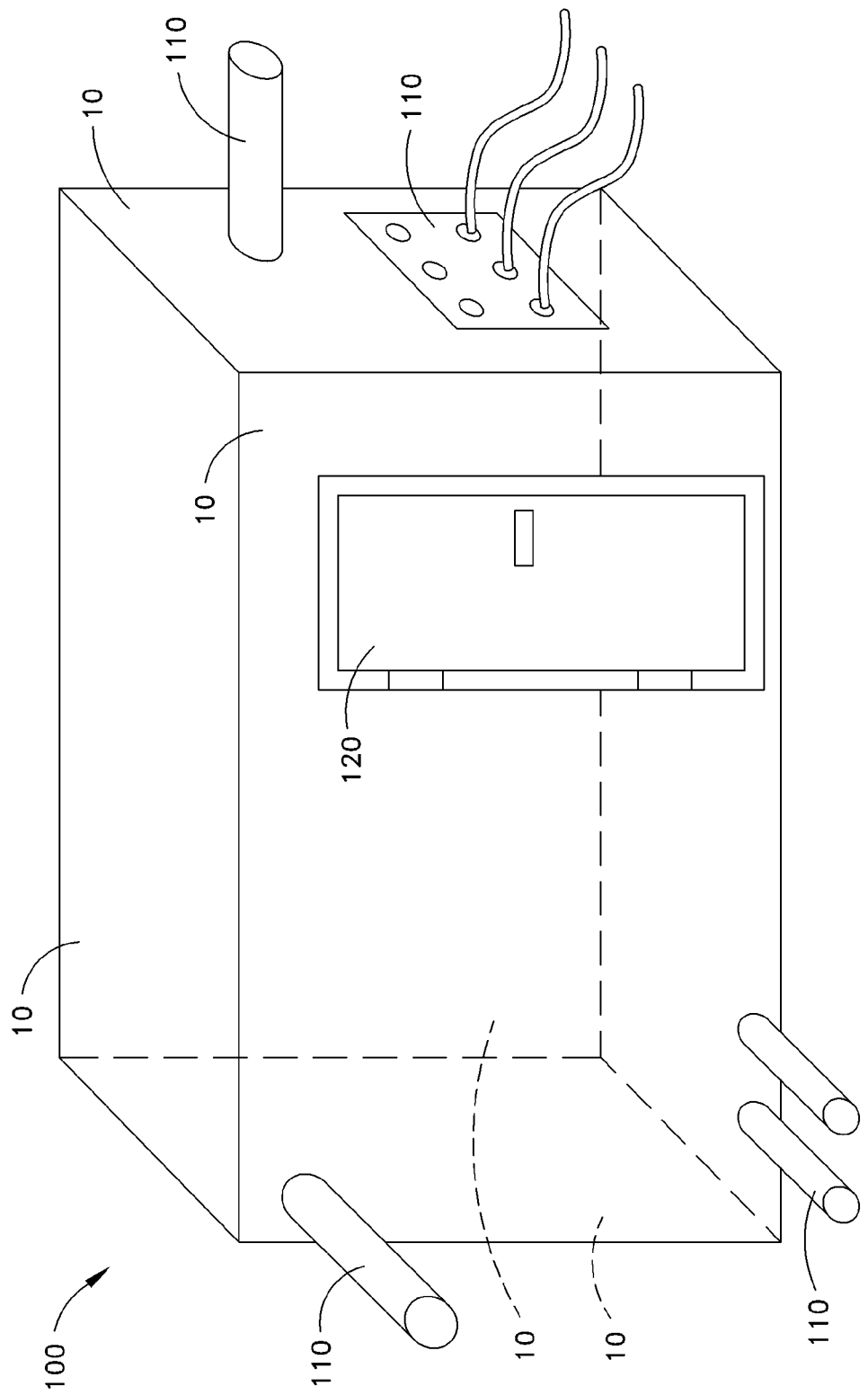
FIG. 3 is a schematized perspective view of an example use of an article for a tent in accordance with at least one aspect of the present invention.

Other examples of the incorporation of the article 10 within an item include non-clothing items. One specific example of non-clothing item is a tent 100 (FIG. 3) or other cloth-based structure. FIG. 3 is an example of a cloth tent structure 100 made using the cloth 10. It is to be appreciated that the tent 100 may house people and other potential recipients of electromagnetic energy. Some specific examples of such recipients of potential electromagnetic energy include equipment devices or the like which are sensitive to electromagnetic energy and thus desirable to protect from electromagnetic energy. Some specific examples include electronic devices which are sensitive to receipt of external electromagnetic energy.

Turning back to the example shown in FIG. 3, it is contemplated that the tent 100 may have various non-fabric aspects in components 110 to allow electrical connection, heating ventilation access, etc. Also, other structures/components, such as a door 120, may be provided.

It is to be appreciated that other structures could also utilize the present invention. Some examples of such other structures include aircraft, military vehicles and watercraft. Also it is to be appreciated that the present invention could be incorporated into arrangements that provide other function. An example includes providing the present invention as part of a bullet-proof vest or the like.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims.

What is claimed is:

1. A cloth article for providing protection from electromagnetic energy, the cloth article including:
   conductive fibers extending within the cloth article;
   varistor material dispersed and secured within the cloth article; and
   ferrite material dispersed and secured within the cloth article.

2. The cloth article as set forth in claim 1, wherein the conductive fibers include carbon fibers.

3. The cloth article as set forth in claim 1, wherein the varistor material is within particles.

4. The cloth article as set forth in claim 3, wherein the size of the particles of the varistor material is approximately 50 nm to 50 micron in diameter.

5. The cloth article as set forth in claim 1, wherein the ferrite material is within particles.

6. The cloth article as set forth in claim 1, wherein the varistor material and the ferrite material are within particles.

7. The cloth article as set forth in claim 1, wherein the varistor material is particulate and the ferrite material is coated onto the varistor material particulate.

8. The cloth article as set forth in claim 7, wherein the size of the particles of the varistor material is approximately 50 nm to 50 micron in diameter and the thickness of the ferrite material that is coated onto the varistor material particle is approximately 5 nm-100 nm.

9. The cloth article as set forth in claim 1, wherein at least one of the varistor material and the ferrite material is within particles, the particles are secured relative to the conductive fibers within the cloth article.

10. The cloth article as set forth in claim 9, wherein the particles are secured within a polymer material adhered with the conductive fibers within the cloth article.

11. The cloth article as set forth in claim 1, wherein the conductive fibers provide a protection from electromagnetic energy over a first range of frequencies of electromagnetic energy, the varistor material provides a protection from electromagnetic energy over a second range of frequencies of electromagnetic energy, and the ferrite material provides a protection from electromagnetic energy over a third range of frequencies of electromagnetic energy, and the first, second and third ranges of frequencies being different from each other.

12. The cloth article as set forth in claim 1, wherein the cloth article is an article of clothing.

13. The cloth article as set forth in claim 1, wherein the cloth article is a sheet material.

14. The cloth article as set forth in claim 1, wherein the cloth article is flexible.

15. The cloth article as set forth in claim 1, wherein the provided protection is for electromagnetic energy including frequencies in the range of approximately 50 Hz to approximately 300 GHz.

16. A method of providing cloth article that can provide protection from electromagnetic energy, the method including:
providing conductive fibers extending within the cloth article;
providing varistor material dispersed and secured within the cloth article; and
providing ferrite material dispersed and secured within the cloth article.

17. A method as set forth in claim 16, wherein the step of providing the conductive fibers includes providing carbon fibers as the conductive fibers.

18. A method as set forth in claim 16, wherein the step of providing varistor material includes providing the varistor material within particles.

19. A method as set forth in claim 16, wherein the step of providing ferrite material includes providing the ferrite material within particles.

20. A method as set forth in claim 16, wherein the steps of providing varistor material and providing ferrite material includes providing the varistor material as particulate with the ferrite material coated onto the varistor material particulate.

* * * * *